United States Patent
Amemiya et al.

(10) Patent No.: US 9,984,798 B2
(45) Date of Patent: May 29, 2018

(54) JUMPER OR CURRENT DETECTION RESISTOR ELEMENT

(71) Applicant: KOA CORPORATION, Ina-shi, Nagano (JP)

(72) Inventors: Hitoshi Amemiya, Ina (JP); Satoshi Chiku, Ina (JP); Takanori Kikuchi, Ina (JP)

(73) Assignee: KOA CORPORATION, Ina-shi (JP)

( * ) Notice: Subject to any disclaimer, the term of this patent is extended or adjusted under 35 U.S.C. 154(b) by 58 days.

(21) Appl. No.: 15/022,619

(22) PCT Filed: Sep. 19, 2014

(86) PCT No.: PCT/JP2014/074832
§ 371 (c)(1),
(2) Date: Mar. 17, 2016

(87) PCT Pub. No.: WO2015/046050
PCT Pub. Date: Apr. 2, 2015

(65) Prior Publication Data
US 2016/0225497 A1 Aug. 4, 2016

(30) Foreign Application Priority Data

Sep. 24, 2013 (JP) ................................. 2013-196548

(51) Int. Cl.
*H01C 1/142* (2006.01)
*H01C 13/00* (2006.01)
(Continued)

(52) U.S. Cl.
CPC ........... *H01C 1/142* (2013.01); *G01R 15/146* (2013.01); *G01R 19/0092* (2013.01); *H01C 13/00* (2013.01)

(58) Field of Classification Search
CPC ...... H01C 1/142; H01C 13/00; G01R 15/146; G01R 19/0092
(Continued)

(56) References Cited

U.S. PATENT DOCUMENTS 5,966,067 A * 10/1999 Murakami ............. H01C 1/142
338/307
2005/0258930 A1 11/2005 Ishida et al.
(Continued)

FOREIGN PATENT DOCUMENTS

| JP | 11-111504 A | 4/1999 |
|---|---|---|
| JP | 2001-118701 A | 4/2001 |

(Continued)

OTHER PUBLICATIONS

International Search Report dated Nov. 11, 2014, issued in counterpart International Application No. PCT/JP2014/074832 (2 pages).

*Primary Examiner* — Kyung Lee
*Assistant Examiner* — Iman Malakooti
(74) *Attorney, Agent, or Firm* — Westerman, Hattori, Daniels & Adrian, LLP

(57) ABSTRACT

Provided is a jumper or current detection resistor element having suppressed occurrence of connection defects resulting from the electromigration. The element (1) of the invention comprises a main body (11) consisting of a metal plate-shaped body, and terminal sections (12) provided at both ends of the main body; the terminal sections protruding from the main body, and both terminal sections provided with a mounting surface; and curved or cut surfaces (A, B, C, D, E) formed at periphery of the mounting surface. Both terminal sections are further provided with opposing surfaces at inside in direction of disposition of both terminal (Continued)

sections, and thickness of the opposing surfaces decreases from the mounting surface (13) to the main body (11).

6 Claims, 6 Drawing Sheets

(51) Int. Cl.
*G01R 15/14* (2006.01)
*G01R 19/00* (2006.01)

(58) Field of Classification Search
USPC .......................................... 338/327
See application file for complete search history.

(56) References Cited

U.S. PATENT DOCUMENTS

| | | | | |
|---|---|---|---|---|
| 2010/0328021 A1* | 12/2010 | Hirasawa | ............... | H01C 1/028 338/226 |
| 2012/0223807 A1* | 9/2012 | Sakai | ..................... | H01C 1/142 338/327 |
| 2012/0299694 A1* | 11/2012 | Smith | ..................... | H01C 1/142 338/327 |

FOREIGN PATENT DOCUMENTS

| | | |
|---|---|---|
| JP | 2006-5327 A | 1/2006 |
| JP | 2009-43958 A | 2/2009 |
| WO | 2009/096386 A1 | 8/2009 |

* cited by examiner

[FIG. 1]
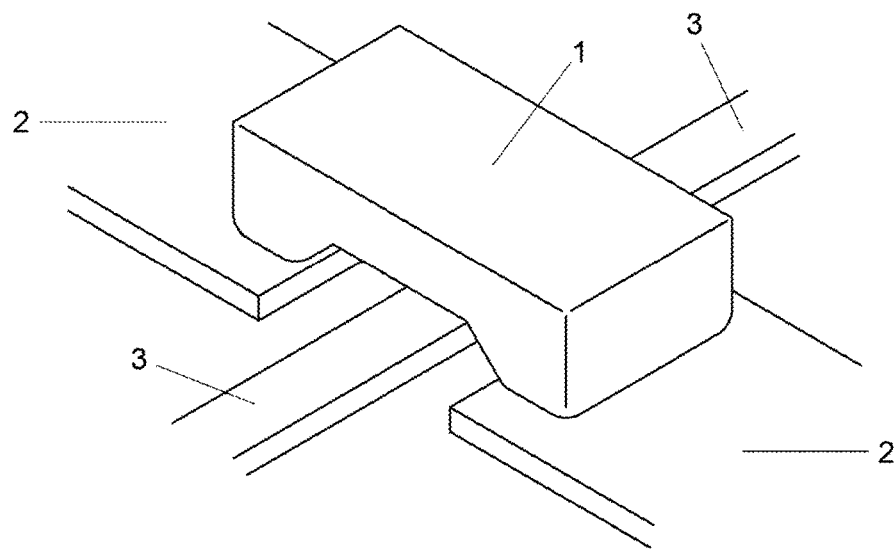
[FIG. 2]
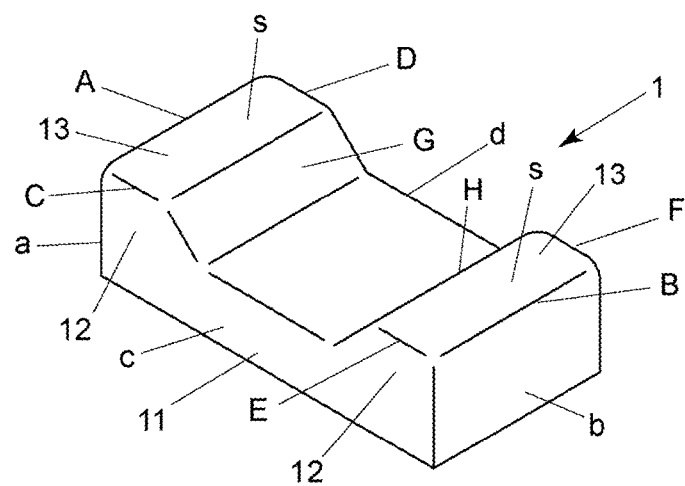

[FIG. 3]
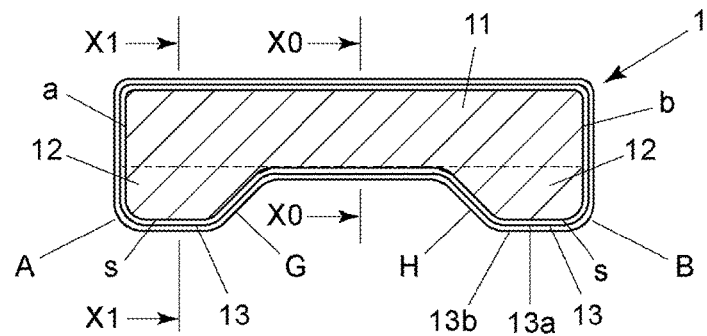
[FIG. 4]
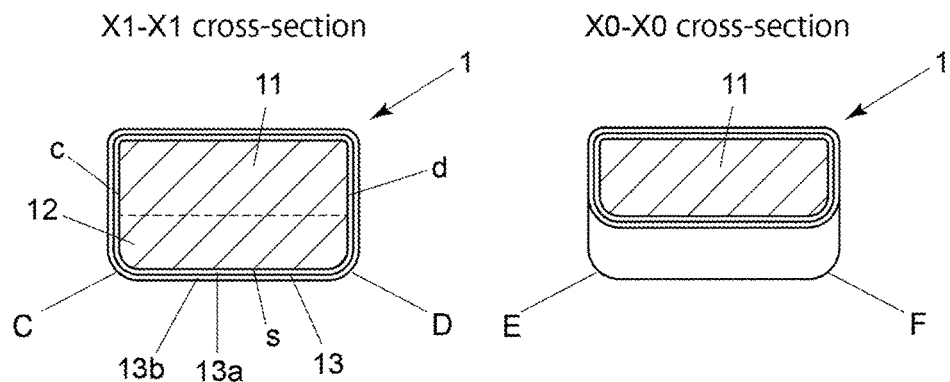
[FIG. 5]
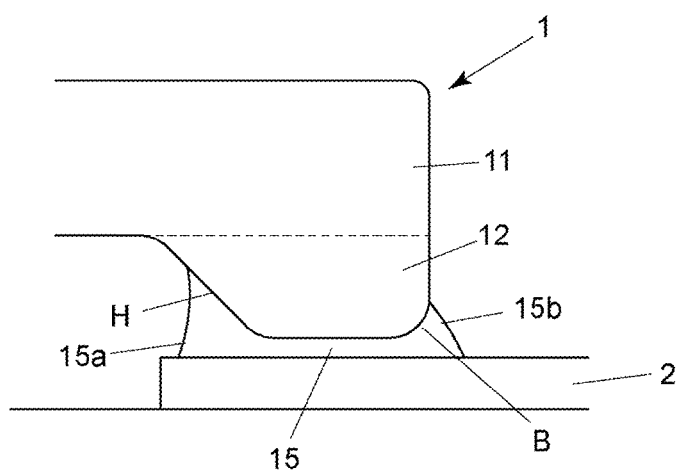

[FIG. 6]
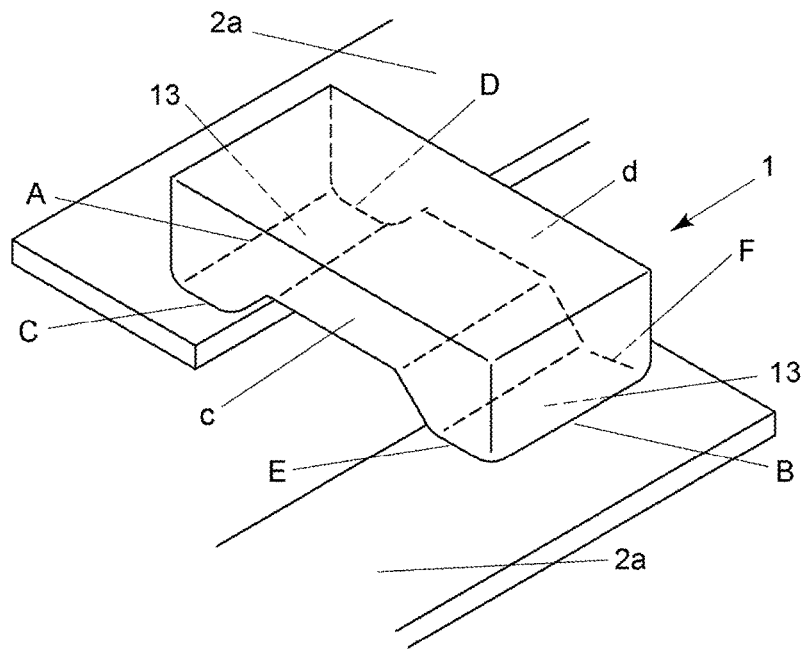
[FIG. 7]
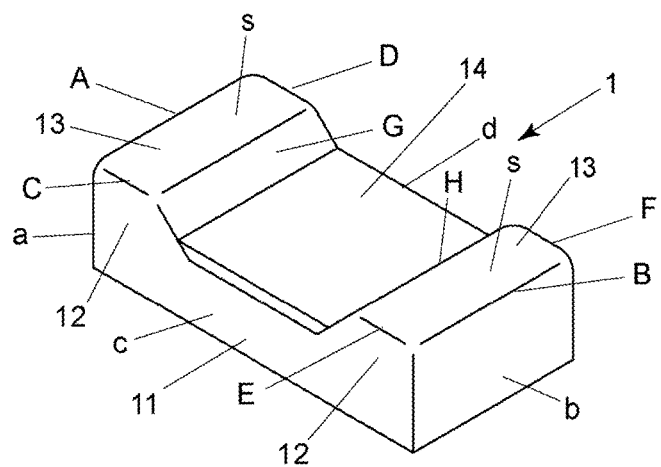

[FIG. 8A]
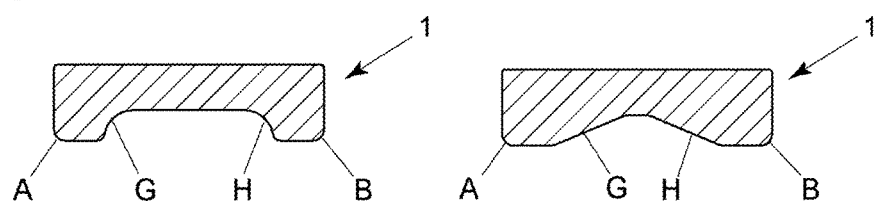
[FIG. 8B]
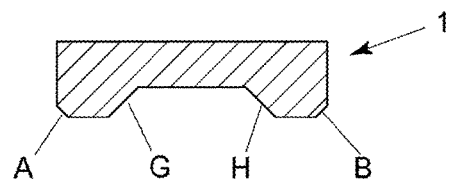
[FIG. 8C]
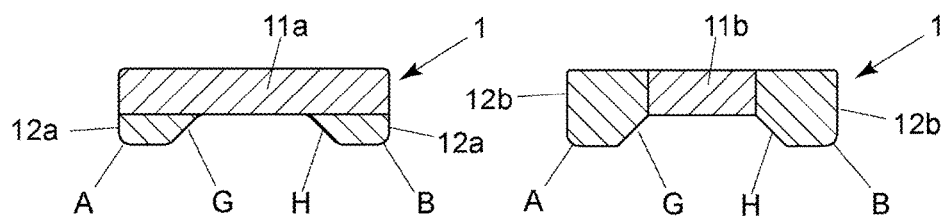

[FIG. 9]
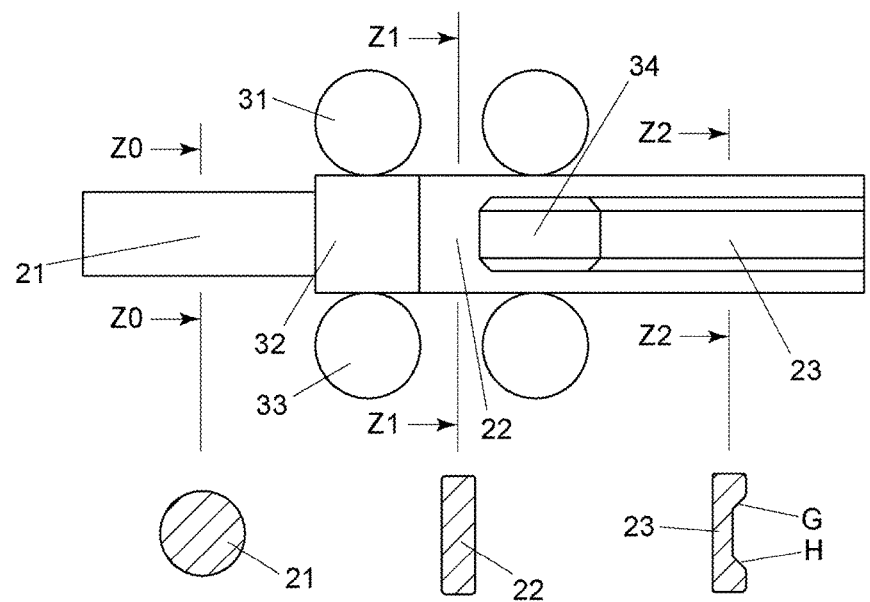
[FIG. 10]
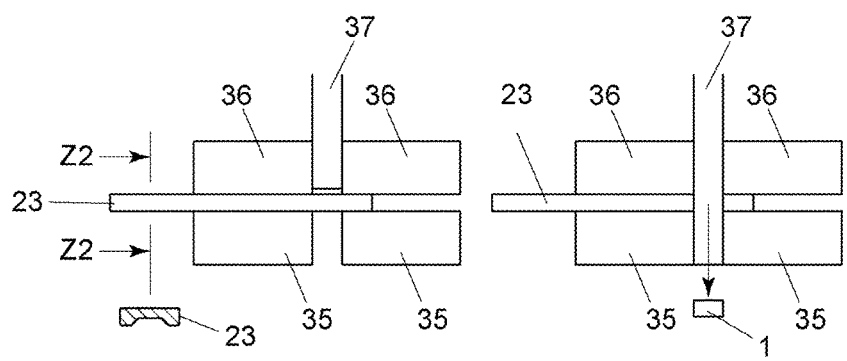

[FIG. 11]
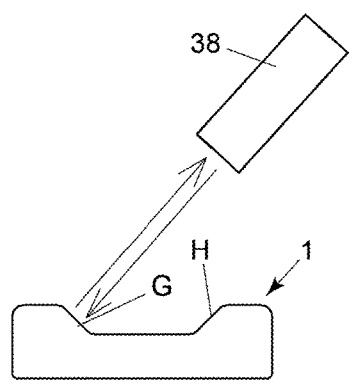
[FIG. 12]
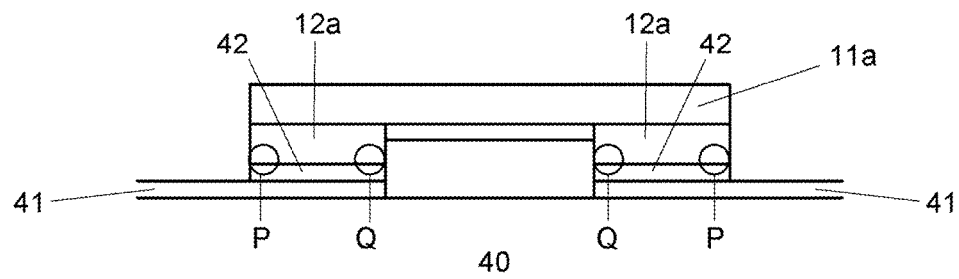

JUMPER OR CURRENT DETECTION RESISTOR ELEMENT

TECHNICAL FIELD

The present invention relates to a jumper or current detection resistor element, and particularly relating to a structure of the element.

BACKGROUND ART

The jumper elements have been used as components, which are mounted on printed circuit boards etc. The jumper element is used, as an example, for crossing over a wiring. Also, the jumper element is used for short-circuiting lands, which were formed for connecting parts therebetween when designing, but now it becomes not necessary.

On the other hand, current detection resistor elements have been used as components to be mounted on printed circuit boards etc. The resistor elements detect currents by detecting a voltage caused at both ends of the resistance element, through which the current flows. The resistor elements have been used for overcurrent detections, current controls, power management controls etc. in electronics equipment such as in automobiles, personal computers, portable equipment etc. As an example, a structure of a jumper or current detection resistor element has been disclosed in laid-open patent publication JP 2001-118701.

SUMMARY OF INVENTION

Technical Problem

These jumper or current detection resistor elements have been recently often used for flowing a large current therethrough in power supply equipment etc. When the large current is applied to a jumper or resistor element flowing therethrough, an electromigration may happen by increased current density at mounted portions, and possibilities exist to cause connection defects.

FIG. 12 shows a mounted structure of a conventional jumper or resistor element. Generally, copper is used for a material of terminal sections 12$a$, which are disposed at both ends of jumper or resistor element. The terminal sections 12$a$ are fixed on wiring patterns 41 on a printed circuit board 40 by solders. In the case, current density generally becomes high at end portions of terminal sections 12$a$ as shown by P or Q. Therefore, depending on the current density, the electromigration may progress gradually from at end portions P or Q, and connection defects may happen.

According to current detection resistor elements, there are cases where voltage detection terminals are pulled out from between a pair of wiring patterns 41. In the case, when the electromigration progresses at portion Q, an error voltage is caused to be detected around the portion Q, and problems of influencing current detection accuracy harmfully may happen.

The invention has been made basing on above-mentioned circumstances. Therefore, an object of the invention is to provide a jumper or current detection resistor element, which can suppress occurrences of connection defects according to the electromigration.

Solution to Problem

The jumper or current detection resistor element of the invention comprises a main body consisting of a metal plate-shaped body, and terminal sections provided at both ends of the main body; wherein the terminal sections protrude from the main body, and the terminal sections are provided with a mounting surface thereon; and wherein curved or cut surfaces are formed at periphery of the mounting surface. Further, the terminal sections are provided with opposing surfaces at inside in direction of disposition of the terminal sections, and thickness of the opposing surfaces decreases from the mounting surface to the center portion of the main body.

According to the invention, since terminal sections are protruding from the main body, and provided with mounting surfaces that has curved or cut surfaces around the mounting surface, current density can be dispersed when mounted, and localized current concentration can be decreased at the periphery of the mounting surface. Thus, the element can have high tolerance against the electromigration.

BRIEF DESCRIPTION OF DRAWINGS

FIG. 1 shows a perspective view of a mounted structure of the jumper or resistor element of an embodiment of the invention.

FIG. 2 shows a perspective view of an appearance of the element in the upset state.

FIG. 3 shows a cross-sectional view of the element along a length-wise direction.

FIG. 4 shows cross-sectional views of the element along width-wise directions. Left view shows X1-X1 cross section in FIG. 3, and right view shows X0-X0 cross section in FIG. 3.

FIG. 5 shows an enlarged view around the terminal section of the element.

FIG. 6 shows a perspective view of a mounted structure of the jumper or resistor element of another embodiment of the invention.

FIG. 7 shows a perspective view of an appearance of the element in the upset state, where a protective layer is formed on bottom surface of the main body.

FIG. 8A shows cross-sectional views of the element along a length-wise direction according to modified embodiments of the invention.

FIG. 8B shows a cross-sectional view of the element along a length-wise direction according to a modified embodiment of the invention.

FIG. 8C shows a cross-sectional view of the element along a length-wise direction according to modified embodiments of the invention.

FIG. 9 shows a view of steps for forming the element, where a square rod of the section rectangle is formed from a round rod of the section circle, and a concave portion is formed on a surface of the square rod.

FIG. 10 shows views of punching process of the element.

FIG. 11 shows a view of inspection process of the element.

FIG. 12 shows a view of a mounted structure of the element according to the conventional technology.

DESCRIPTION OF EMBODIMENTS

Embodiments of the invention will be described below with referring to FIG. 1 through FIG. 11. Like or corresponding parts or elements will be denoted and explained by same reference characters throughout views. In the following embodiments, a jumper element or a current detection resistor element will be described. However, both elements have the same structure, only having a difference that material of the main body is different.

As shown in FIG. 1, the element 1 is used as a jumper element of an embodiment of the invention. The element 1 is used where wiring 2 steps over wiring 3. The element 1 includes main body 11 consisting of high conductivity plate-shaped metal such as Cu etc., and terminal sections 12 provided at both ends of the main body. The terminal sections 12 protrude from the main body 11 as shown in FIG. 2 through FIG. 4.

Coated metal layers 13a, 13b are formed at least on the terminal sections 12 as shown in FIG. 3. Mounting surfaces 13 are formed at least on bottom surfaces of the terminal sections 12 for connecting to wiring lands with solders. The mounting surface 13 is provided with first metal layer 13a and second metal layer 13b. In the embodiment, first metal layer 13a is Ni layer, and second metal layer 13b is Sn layer.

The main body 11 and the terminal sections 12 are integrally formed and consisting of same metal material (Cu). In the embodiment, entire surfaces of element 1 are covered with first metal layer 13a and second metal layer 13b as well as mounting surfaces 13.

As to metal layers, first metal layer 13a of Ni is formed by plating on base material of Cu of the main body 11 and the terminal sections 12. And, second metal layer 13b of Sn (or solder) is formed by plating on the first metal layer 13a. Thickness of the plated layers are set to, for example, between 2 micron meter and 10 micron meter. After this, reference character 13a is sometimes called as Ni layer, and reference character 13b is sometimes called as Sn layer.

Sn layer 13b is formed for obtaining solder wetness. The metal material of first metal layer 13a has higher resistivity than the metal material of terminal sections 12. And, the metal material of first metal layer 13a has higher melting point than solder material for mounting the element. Therefore, metal layers directly covering the main body and/or the terminal sections are not affected by heat applied at solder process such as a flow or reflow process.

Electrical resistivity (specific resistance)/Melting point of the metal material in the embodiments are as follows.
Cu: $1.7\mu\Omega\cdot cm/1084°$ C.
Ni: $8.5\mu\Omega\cdot cm/1455°$ C.
Sn: $11.4\mu\Omega\cdot cm/230°$ C.
Chip size of the element 1 is, for an example, length (L): 1.6 mm, width (W): 0.8 mm, and height (H): 0.45 mm.

Since, Ni layer 13a is interposed between base material Cu and Sn layer (or solder layer) 13b, the Ni layer 13a, which has higher resistivity than Cu, can disperse current density distribution in terminal sections 12, and then current concentration to local area in terminal sections 12 can be decreased. So, it can make the element 1 to have high tolerance against the electromigration. Base material Cu and Sn layer 13b may form an alloy under high temperature conditions, and It may cause the electromigration. However, by interposing Ni layer 13a between base material Cu and Sn layer 13b, the electromigration can be controlled.

It is also acceptable to use Ni—P layer, which is formed by nonelectrolyte plating of Ni, instead of Ni layer 13a. Also, Ni—Cr system alloy can be used. The Ni layer 13a may be formed only at bottom surfaces of the terminal sections and circumferences thereof (part to which solder adheres when mounting). However, as shown in the embodiment, Ni layer 13a may be formed on all over the surfaces of base material Cu, that is, main body 12 and terminal sections 11. Then deterioration of base material Cu can be prevented. Further, Sn layer 13b is prevented from diffusing into base material Cu. Also, as to cost, entire surface plating is advantageous than partial plating.

According to the element 1, as shown in FIG. 2, bottom surface s of terminal sections 12 is formed as the mounting surface 13, and curved or cut surfaces A, B, C, D, E, F are formed at periphery of the mounting surface 13. That is, both terminal sections 12 are provided with end faces a, b at outsides in direction thereof. And, curved or cut surfaces A, B are formed from the end faces a, b to the mounting surfaces 13.

Both terminal sections 12 are provided with side faces c, d, and curved or cut surfaces C, D, E, F, are formed from side faces c, d to the mounting surfaces 13. Both terminal sections 12 are provided with opposing surfaces G, H at inside in direction thereof. Thickness of opposing surfaces G, H decreases from mounting surface 13 (bottom surface s) to center portion of main body 11 to form sloped surfaces. In the embodiment, each boundary of end face a, end face b, side face c, side face d, sloped surface G, and sloped surface H is formed to be a curved surface.

By forming curved or cut surfaces A, B, C, D, E, F and sloped surfaces G, H at periphery of mounting surfaces 13, current density distribution can be dispersed when the element is mounted. Then local electric current concentration on the mounting surfaces can be decreased, and the element can be made to have high tolerance against the electromigration.

It is preferable to make curved surface curvature radius to be 25 μm or more, more preferably to be about from 50 μm to 150 μm. This curvature radius can be applied in case of after forming first metal layer 13a, forming second metal layer 13b, or not forming first metal layer 13a and second metal layer 13b. More preferably, the curvature radius is applied in case of not forming first metal layer 13a and second metal layer 13b or after forming first metal layer 13a.

By the element provided with the sloped surfaces G, H at inside of both terminal sections 12 in direction thereof, as shown in FIG. 5, inside fillets of solders 15 can be formed easily and fixing strength improves. The current flows smoothly, and the localized current concentration can be decreased at mounting surfaces 13. In case that the boundary of main body 11 and inside of terminal sections 12 is right angles as shown in FIG. 12, the boundary becomes current concentrated points, and becomes hot spots. According to the sloped surfaces G, H, the current concentration becomes decreased, and in case of the current detection resistor element, the pulse tolerance improves, and the aged deterioration of the detection accuracy can be controlled. Further, the boundary of mounting surfaces 13 (bottom surface s) and sloped surface G or H is made to be a curved surface.

In case of mounting the element 1 in right angles direction to wiring patterns 2a, as shown in FIG. 6, the current, which flows from a wiring pattern 2a to another wiring pattern 2a through mounting surfaces 13 of the element 1, concentrates to curved surfaces D, E formed at boundary of side faces c, d and mounting surface 13. Thus, since the current concentration portions are different according to mounting conditions, installing curved surfaces A, B, C, D, E, F in surroundings of mounting surfaces 13 of the element 1 is effective for decreasing localized current concentration in various mounting conditions.

It is preferable to form a protective layer 14 consisting of epoxy resin etc. on bottom (mounting) surface side of main body 11 as shown in FIG. 7. In case of the element 1 being the current detection resistor element, changing of resistance value according to crawling up of the solder when mounting can be prevented by the protective layer 14. Moreover, in case of soldering the element 1 on printed circuit board in a flow process, providing with the protective layer 14 makes solder flow possible by using adhesive for temporally fixing.

FIG. 8A through FIG. 8C shows modified structures of the element 1. Left view in FIG. 8A shows the sloped surface G, H being modified to a curved surface. Right view in FIG. 8A shows the sloped surface G, H being modified to a gentle inclination angle. FIG. 8B shows the curved surface A, B being modified to a cut surface. It is preferable to make the angle of about 45° to bottom surface s. Also, width of the cut surface is preferably 25 μm or more, more preferably from 50 μm to 150 μm.

FIG. 8C shows examples of the element 1 being a current detection resistor element, where main body 11a (11b) and terminal sections 12a (12b) consist of different bodies and connecting them. Left view shows a current detection resistor element, which connects terminal sections 12a consisting of highly conductive metal material such as Cu etc. to lower surface of main body 11a consisting of resistive metal material such as Cu—Mn or Cu—Ni system alloy etc.

Right view shows another current detection resistor element, which connects terminal sections 12a consisting of highly conductive metal material such as Cu etc. to end faces of main body 11a consisting of resistive metal material such as Cu—Mn or Cu—Ni system alloy etc. Moreover, the structure explained as a jumper element may be used to the structure of a current detection resister element, and the structure explained as a current detection resistor element may be used to the structure of a jumper element.

FIG. 9 through FIG. 11 shows an example for manufacturing an element 1. As shown in FIG. 9, a rod metal material 21 (consisting of Cu, Cu—Mn system, or Cu—Ni system etc.) whose cross section is circle, is rolled from four sides by rolls 31, 32, 33, and not shown to form a square rod 22 whose cross section is rectangular. Since cross section of the departure material is circle, the corners of the square rod become curved surfaces. Next, a concave portion is formed with rolling by using roll 34. Then, terminal sections 12 protruding from the main body 11 are formed, and the square rod 23 having sloped surfaces G, H at inside in direction of disposition of the terminal sections is formed.

As shown in FIG. 10, the square rod 23 is fixed by die 35 and guide 36 so that the concave portion looks down in the view (see left view), and the element 1 consisting of metal material is pierced by using punch 37, and separated from the square rod 23 (see right view). When piercing, burrs are caused. However, since the punch is applied to the flat surface (top surface) of the element, corners of mounting surface (bottom surface) side become round, and burrs are not caused at the corners thereof. According to the process, the element 1 consisting of metal material, which has curved surfaces A, B, C, D, E, F and sloped surfaces G, H around mounting surfaces, can be formed.

Next, the Ni layer 13a is formed with the electrolytic plating of Ni, and the Su layer 13b is formed with the electrolytic plating of Su. Then, the element 1 of the invention having metal layers is completed. It is necessary to distinguish top or bottom of the element in the process of attaching the elements on a tape etc. As shown in FIG. 11, since the element 1 is provided with sloped surfaces G, H, top or bottom of the element 1 can be easily distinguished by reflections of lights by using optical sensor 38 etc.

Although embodiments of the invention have been explained, however the invention is not limited to above embodiments, and various changes and modifications may be made within scope of the technical concepts of the invention.

INDUSTRIAL APPLICABILITY

The invention can be used for jumper or current detection resistor elements, which will be surface mounted on printed circuit boards. According to the elements, connection defects resulting from the electromigration can be controlled.

The invention claimed is:

1. A jumper or current detection resistor element comprising:
   a main body consisting of a metal plate-shaped body; and terminal sections provided at both ends of the main body,
   wherein the main body and the terminal sections are integrally formed and consisting of same metal material,
   wherein the terminal sections protrude from the main body, and the terminal sections are provided with a mounting surface thereon,
   wherein curved surfaces of curvature radius to be 25 μm or more or cut surfaces of width to be 25 μm or more are formed at periphery of the mounting surface,
   wherein the terminal sections are provided with side faces along direction of disposition of both terminal sections, and the curved surfaces or the cut surfaces are formed from the side face to the mounting surface, and
   wherein the terminal sections are provided with opposing surfaces at inside in direction of disposition of the terminal sections, and thickness of the opposing surfaces decreases from the mounting surface to the main body.

2. The element of claim 1, wherein the terminal sections are provided with outer end faces in direction of disposition of both terminal sections, and the curved surfaces or the cut surfaces are formed from the end face to the mounting surface.

3. The element of claim 1, wherein the terminal sections are provided with coated metal layers.

4. The element of claim 3, wherein the element is provided with the coated metal layers over one of the terminal section, the main body, and the other terminal section.

5. The element of claim 3, wherein the metal material of one of the coated metal layers has higher resistivity than the metal material of the terminal sections.

6. The element of claim 5, wherein the metal material of one of the coated metal layers has a higher melting point than the melting point of a solder material for mounting.

* * * * *